(12) United States Patent
Choi

(10) Patent No.: US 12,721,057 B2
(45) Date of Patent: Aug. 25, 2026

(54) VACUUM PACKAGING MANUFACTURING METHOD AND SEMICONDUCTOR DEVICES MANUFACTURED THEREBY

(71) Applicant: SEOUL NATIONAL UNIVERSITY R&DB FOUNDATION, Seoul (KR)

(72) Inventor: Woo Young Choi, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 400 days.

(21) Appl. No.: 18/405,328

(22) Filed: Jan. 5, 2024

(65) Prior Publication Data

US 2024/0312782 A1 Sep. 19, 2024

Related U.S. Application Data

(63) Continuation of application No. PCT/KR2023/019459, filed on Nov. 29, 2023.

(30) Foreign Application Priority Data

Mar. 17, 2023 (KR) ........................ 10-2023-0035045

(51) Int. Cl.
*H10P 14/20* (2026.01)
*H10P 14/43* (2026.01)
(Continued)

(52) U.S. Cl.
CPC .......... *H10P 14/3411* (2026.01); *H10P 14/43* (2026.01); *H10P 50/283* (2026.01); *H10P 72/0438* (2026.01); *H10W 20/056* (2026.01)

(58) Field of Classification Search
CPC .... H10P 14/3411; H10P 14/43; H10P 50/283; H10P 72/0438; H10W 20/056
See application file for complete search history.

(56) References Cited

U.S. PATENT DOCUMENTS 7,923,790 B1 * 4/2011 Quevy ................ B81C 1/00293
257/415
9,796,582 B1 * 10/2017 Cheng ................ B81C 1/00246
(Continued)

FOREIGN PATENT DOCUMENTS

KR 10-2011-0075354 A 7/2011
KR 10-2014-0071855 A 6/2014
(Continued)

*Primary Examiner* — Mark W Tornow
(74) *Attorney, Agent, or Firm* — Bridgeway IP Law Group, PLLC; Jihun Kim

(57) ABSTRACT

A vacuum packaging manufacturing method includes forming, on a silicon wafer, a lower layer including a first metal layer and a second metal layer formed on the first metal layer, forming anchor regions by etching parts of the second metal layer and depositing a dielectric layer on the second metal layer in which the anchor regions are formed, exposing a silicon oxide film by removing a partial region of the dielectric layer and removing silicon oxide inside the second metal layer covered by the dielectric layer through the removed partial region of the dielectric layer, and depositing an upper layer on the second metal layer and forming a third metal structure on the upper layer, wherein, as the upper layer is deposited on the second metal layer, a region from which the silicon oxide inside the second metal layer is removed is in a vacuum or subvacuum state.

14 Claims, 11 Drawing Sheets

(51) Int. Cl.

| | |
|---|---|
| ***H10P 50/28*** | (2026.01) |
| ***H10P 72/00*** | (2026.01) |
| ***H10W 20/00*** | (2026.01) |

(56) References Cited

U.S. PATENT DOCUMENTS

| | | | | |
|---|---|---|---|---|
| 11,305,985 | B2 * | 4/2022 | Sun | H10N 30/877 |
| 2016/0137492 | A1 * | 5/2016 | Cheng | B81C 1/00238 438/51 |

FOREIGN PATENT DOCUMENTS

| | | | |
|---|---|---|---|
| KR | 10-1422387 | B1 | 7/2014 |
| KR | 101588642 | B1 | 1/2016 |
| KR | 10-2016-0053935 | A | 5/2016 |
| KR | 10-2019-0049126 | A | 5/2019 |
| KR | 10-2020-0069497 | A | 6/2020 |

* cited by examiner

VACUUM PACKAGING MANUFACTURING METHOD AND SEMICONDUCTOR DEVICES MANUFACTURED THEREBY

CROSS-REFERENCE TO RELATED APPLICATION

This application is a continuation of International Application No. PCT/KR2023/019459 filed on Nov. 29, 2023, which claims priority to Korean Patent Application No. 10-2023-0035045 filed on Mar. 17, 2023, the entire contents of which are herein incorporated by reference.

BACKGROUND

The present disclosure relates to a vacuum packaging manufacturing method of a semiconductor device and a semiconductor device manufactured by the vacuum packaging manufacturing method, and more specifically, to a technology for removing silicon oxide in a metal layer to form a vacuum cavity for integrating electronic devices into a wiring layer of a complementary metal oxide semiconductor (CMOS) circuit.

In general, vacuum packaging has been used in a micro-electromechanical system (MEMS) field and uses bonding or coupling. A vacuum packaging process is diverse and may be divided into a direct bonding process and a bonding process using an intermediate layer.

The direct bonding process has an advantage of a simple process and high bonding strength, but when bonding dissimilar materials, thermal stress increases due to a difference in coefficient of thermal expansion (CTE) of each material, and thereby, warpage of a wafer may occur, affecting the reliability or performance of a device. The bonding process using an intermediate layer may bond a variety of substrates to each other and greatly reduce the impact of CTE, thereby having been widely used recently.

Also, a bonding temperature is relatively low in the bonding process, there is an advantage of reducing the influence of MEMS devices during bonding. However, the bonding process has a disadvantage in which the process is generally complicated and a bonding strength is low. For MEMS bonding, an appropriate process has to be selected depending on conditions, such as a bonding temperature, a substrate material, vacuum or sealing of a package, and compatibility with a semiconductor process. The direct bonding process includes fusion bonding and anodic bonding, and the bonding process using an intermediate layer includes glass frit bonding, eutectic bonding, diffusion bonding, and adhesive bonding.

However, there are recent problems having limitations in terms of process temperature for integration of CMOS semiconductor chips and electronic devices that have to be driven in vacuum, material/process compatibility with a CMOS process, and process costs.

Accordingly, there is a need to implement a method of forming a vacuum cavity for integration of electronic devices in a wiring layer of a CMOS circuit.

SUMMARY

The present disclosure provides a method of removing e silicon oxide in a metal layer and forming a vacuum cavity for integrating electronic devices into a wiring layer of a complementary metal oxide semiconductor (CMOS) circuit, and a semiconductor device manufactured by the method.

Technical tasks to be achieved by the present disclosure are not limited to the above-described technical objects, and other technical tasks of the present disclosure may be derived from the following description.

According to a first aspect of the present disclosure, a vacuum packaging manufacturing method is provided. The vacuum packaging manufacturing method includes forming, on a silicon wafer, a lower layer including a first metal layer and a second metal layer formed on the first metal layer, forming anchor regions by etching parts of the second metal layer and depositing a dielectric layer on the second metal layer in which the anchor regions are formed, exposing a silicon oxide film by removing a partial region of the dielectric layer and removing silicon oxide inside the second metal layer covered by the dielectric layer through the removed partial region of the dielectric layer, and depositing an upper layer on the second metal layer and forming a third metal structure on the upper layer, wherein, as the upper layer is deposited on the second metal layer, a region from which the silicon oxide inside the second metal layer is removed is in a vacuum or subvacuum state.

Also, according to a second aspect of the present disclosure a packaged semiconductor device is provided. The packaged semiconductor device includes a lower layer including a first metal layer, a second metal layer formed on the first metal layer and including a vacuum or a subvacuum region, and anchor regions formed by etching parts of the second metal layer, a dielectric layer which is formed on the second metal layer in which the anchor regions are formed and from which a part is removed, and an upper layer including a third metal structure formed on top of the second metal layer, wherein the vacuum or subvacuum region is a region from which silicon oxide inside the second metal layer covered by the dielectric layer is removed through a partial region of the dielectric layer and which is formed by depositing the upper layer on the second metal layer.

According to the present disclosure, the existing metal wiring layer is maintained as it is, electronic devices requiring vacuum packaging may be accurately placed in a desired position on the existing chip.

Also, according to the present disclosure, electronic devices that require vacuum may be integrated into a chip three-dimensionally while maintaining most of the existing wiring processes, and thus, costs may be reduced.

Effects of the present disclosure are not limited to the effects described above, and include all effects understood from the following description.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
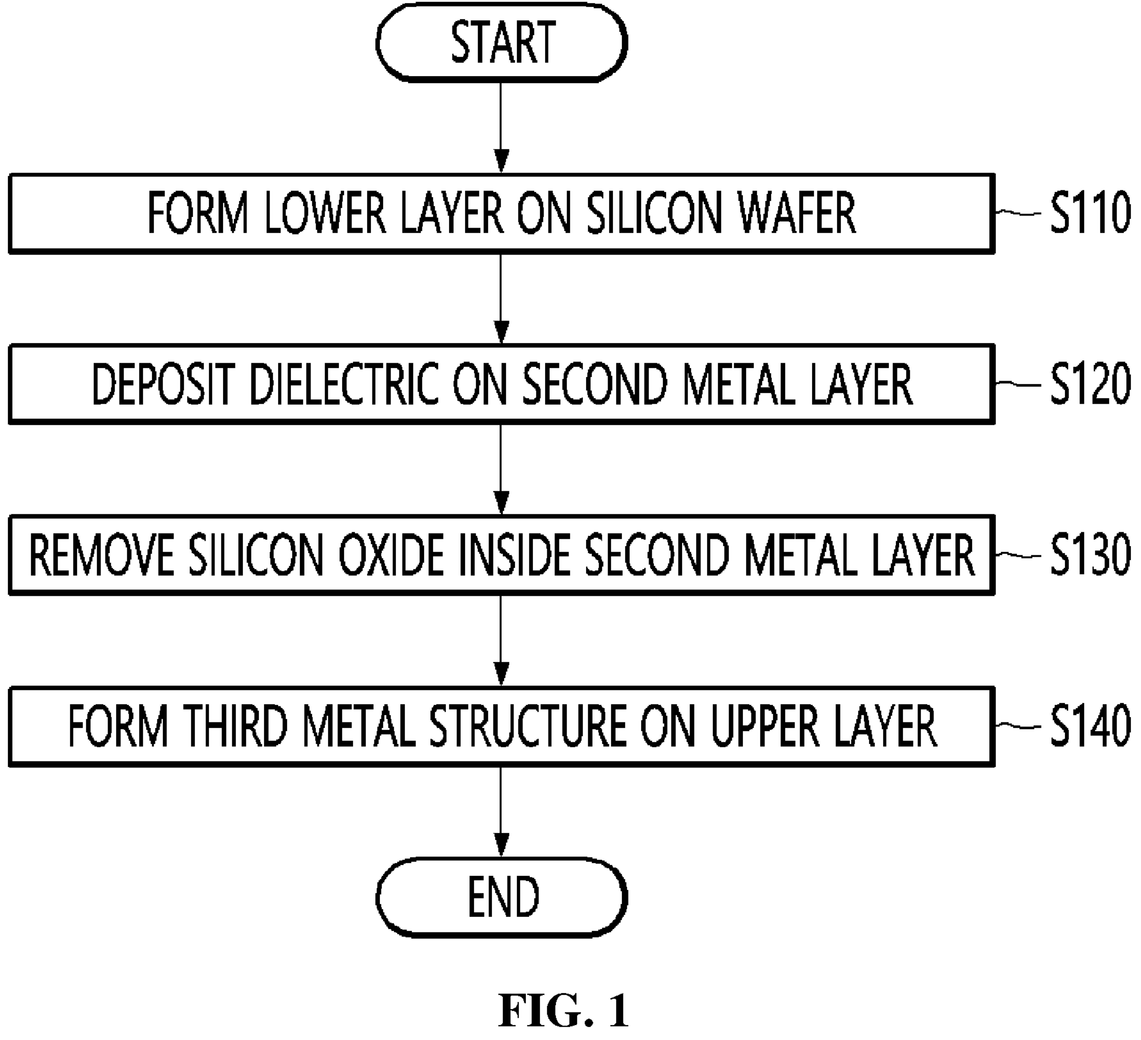
FIG. 1 is a flowchart illustrating a sequence of a vacuum packaging method according to an embodiment of the present disclosure.

Hereinafter, the present disclosure will be described in detail with reference to the attached drawings. Hereafter, the present disclosure will be described in detail with reference to the accompanying drawings. However, the present disclosure may be implemented in many different forms and is not limited to the embodiments described herein. In addition, the accompanying drawings are only for easy understanding of the embodiments disclosed in the present specification, and the technical ideas disclosed in the present specification are not limited by the accompanying drawings. All terms including technical terms and scientific terms used herein should be interpreted as meanings commonly understood by those skilled in the art to which the present disclosure belongs.

The terms defined in the dictionary should be interpreted as having additional meanings corresponding to the related technical documents and the currently disclosed content and are not interpreted in a very ideal or limiting sense unless otherwise defined. In order to clearly describe the present disclosure in the drawings, parts irrelevant to the descriptions are omitted, and a size, a shape, and a form of each component illustrated in the drawings may be variously modified.

The same or similar reference numerals are assigned to the same or similar portions throughout the specification. Suffixes "module" and "unit" for the components used in the following description are given or used interchangeably in consideration of case of writing the specification, and do not have meanings or roles that are distinguished from each other by themselves.

In addition, in describing the embodiments disclosed in the present specification, when it is determined that a detailed descriptions of related known technologies may obscure the gist of the embodiments disclosed in the present specification, the detailed descriptions are omitted. Throughout the specification, when a portion is said to be "connected (coupled, in contact with, or combined)" with another portion, this includes not only a case where it is "directly connected (coupled, in contact with, or combined)" ", but also a case where there is another member therebetween.

In addition, when a portion "includes (comprises or provides)" a certain component, this does not exclude other components, and means to "include (comprise or provide)" other components unless otherwise described. Terms indicating ordinal numbers, such as first and second, used in the present specification are used only for the purpose of distinguishing one component from another component and do not limit the order or relationship of the components. For example, the first component of the present disclosure may be referred to as the second component, and similarly, the second element may also be referred to as the first component.

FIG. 1 is a flowchart illustrating a sequence of a vacuum packaging method according to an embodiment of the present disclosure.

Referring to FIG. 1, a vacuum packaging method includes step S110 of forming a lower layer on a silicon wafer, step S120 of depositing a dielectric layer on a second metal layer, step S130 of removing silicon oxide inside the second metal layer, and step S140 of forming a third metal structure on an upper layer.

Step S110 of forming the lower layer on the silicon wafer is a step of forming, on the silicon wafer, the lower layer including a first metal layer and a second metal layer formed on the first metal layer. For example, the first metal layer may be formed of at least one material selected from inter metal dielectrics (IMD) and inter layer dielectrics (ILD).

The vacuum packaging method may further include a step of planarizing the second metal layer by using a chemical-mechanical polishing (CMP) process after step S110 of forming the lower layer on the silicon wafer.

Step S120 of depositing a dielectric layer on the second metal layer is a step of forming an anchor region by etching a part of the second metal layer and depositing a dielectric layer on the second metal layer on which the anchor region is formed. For example, a plurality of anchor regions may be formed in the second metal layer to perform a function of supporting the dielectric layer, and the dielectric layer may be formed of a SiCN material to prevent the dielectric layer from being easily etched by steam etching of a hydrofluoric acid solution that may be used in a subsequent process.

Step S120 of depositing the dielectric layer on the second metal layer may further include a step of forming a sacrificial layer having a preset thickness on the second metal layer when an upper portion of the second metal layer is adsorbed to the dielectric layer and a mechanical operation is difficult, or when the second metal layer is required to be separated from the dielectric layer.

Step S130 of removing the silicon oxide inside the second metal layer is a step of removing a partial region of the dielectric layer to expose the silicon oxide film and removing the silicon oxide inside the second metal layer covered with the dielectric layer through the partial region of the removed dielectric layer. For example, in step S130 of removing the silicon oxide inside the second metal layer, the dielectric layer seals all surfaces of the second metal layer, and accordingly, a partial region of the dielectric layer may be removed to etch the silicon oxide inside the second metal layer, thereby exposing a silicon oxide film of the metal layer.

In step S130 of removing the silicon oxide inside the second metal layer, the sacrificial layer formed in step S120 of depositing the dielectric layer on the second metal layer may be removed along with the silicon oxide inside the second metal layer. In this case, a gap greater than a preset thickness may be formed between the second metal layer and the sacrificial layer.

In step S130 of removing the silicon oxide inside the second metal layer, the silicon oxide inside the second metal layer may be removed based on steam etching of a hydrofluoric acid solution. For example, in step S130 of removing the silicon oxide inside the second metal layer, the silicon oxide inside the second metal layer may be removed by injecting vapor of a hydrofluoric acid solution into a hole of the dielectric layer, and electronic devices inside the second metal layer may be emitted. In this case, a cavity may be formed in the region where the electronic devices are emitted.

Step S140 of forming a third metal structure on an upper layer is a step of depositing the upper layer on the second metal layer and forming the third metal structure on the upper layer. For example, in step S140 of forming the third metal structure on the upper layer, an IMD material may be deposited on the second metal layer, and the third metal structure may be formed on the upper layer formed of the IMD material. The third metal structure may be formed by the same process as or a similar process to the process in which a second metal structure is formed, and the IMD material may be a material that electrically insulates the second metal structure from the third metal structure.

As the upper layer is deposited on the second metal layer in step S140 of forming the third metal structure on the upper layer, a cavity in a vacuum or subvacuum state is formed in a region where the silicon oxide inside the second metal layer is removed.

Inside the cavity, a vacuum environment identical to a semiconductor process is formed, and various electronic devices may be placed. The same metal layers as the existing metal layers are formed in the other region except for the cavity and may also sufficiently perform the functions of the existing metal layers.

Figure 2:
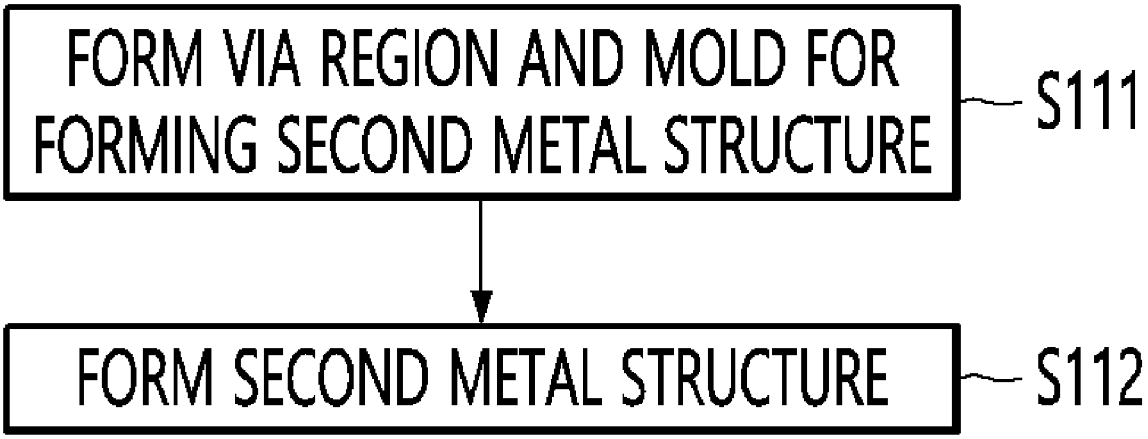
FIG. 2 is a flowchart illustrating details of some steps of the vacuum packaging method illustrated in FIG. 1.

FIG. 2 is a flowchart illustrating details of some steps of the vacuum packaging method illustrated in FIG. 1.

Referring to FIG. 2, step S110 of forming the lower layer on the silicon wafer may include step S111 of forming a via region and a mold for forming a second metal structure and step S112 of forming a second metal structure.

Step S111 of forming the via region and the mold for forming the second metal structure may be a step of forming the via region on a first metal layer and a mold region for forming the second metal structure included in a second metal layer.

Step S112 of forming the second metal structure may be a step of forming the second metal structure by filling a mold region with copper and barrier metal.

Figure 3:
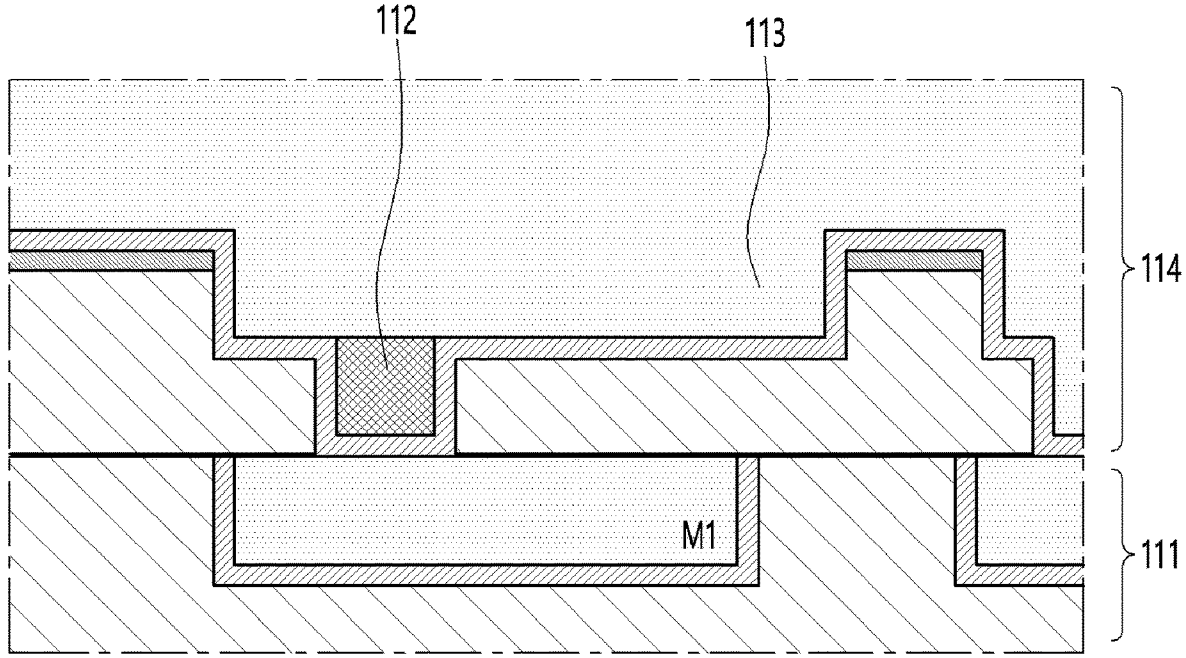
FIGS. 3, 4A, 4B, 5A, 5B, 6A and 6B are views illustrating semiconductor devices at each step to describe detailed steps of the vacuum packaging method illustrated in FIG. 1.

FIGS. 3 to 6B are views illustrating semiconductor devices at each step to describe detailed steps of the vacuum packaging method illustrated in FIG. 1. In more detail, FIG. 3 is a view illustrating a semiconductor device manufactured according to step S110 of forming the lower layer of FIG. 1 on a silicon wafer, FIGS. 4A and 4B are views illustrating semiconductor devices manufactured according to step S120 of depositing a dielectric layer on a second metal layer of FIG. 1, FIGS. 5A and 5B are views illustrating semiconductor devices manufactured according to step S130 of removing silicon oxide inside the second metal layer, and FIGS. 6A and 6B views illustrating semiconductor devices manufactured according to step S140 of forming a third metal structure on an upper layer.

For the sake of convenience of description, FIGS. 3 to 6B assume a situation in which a damascene process using copper is used, a total of three metal layers are used, and a vacuum cavity is formed in a second metal layer.

Figure 4A:
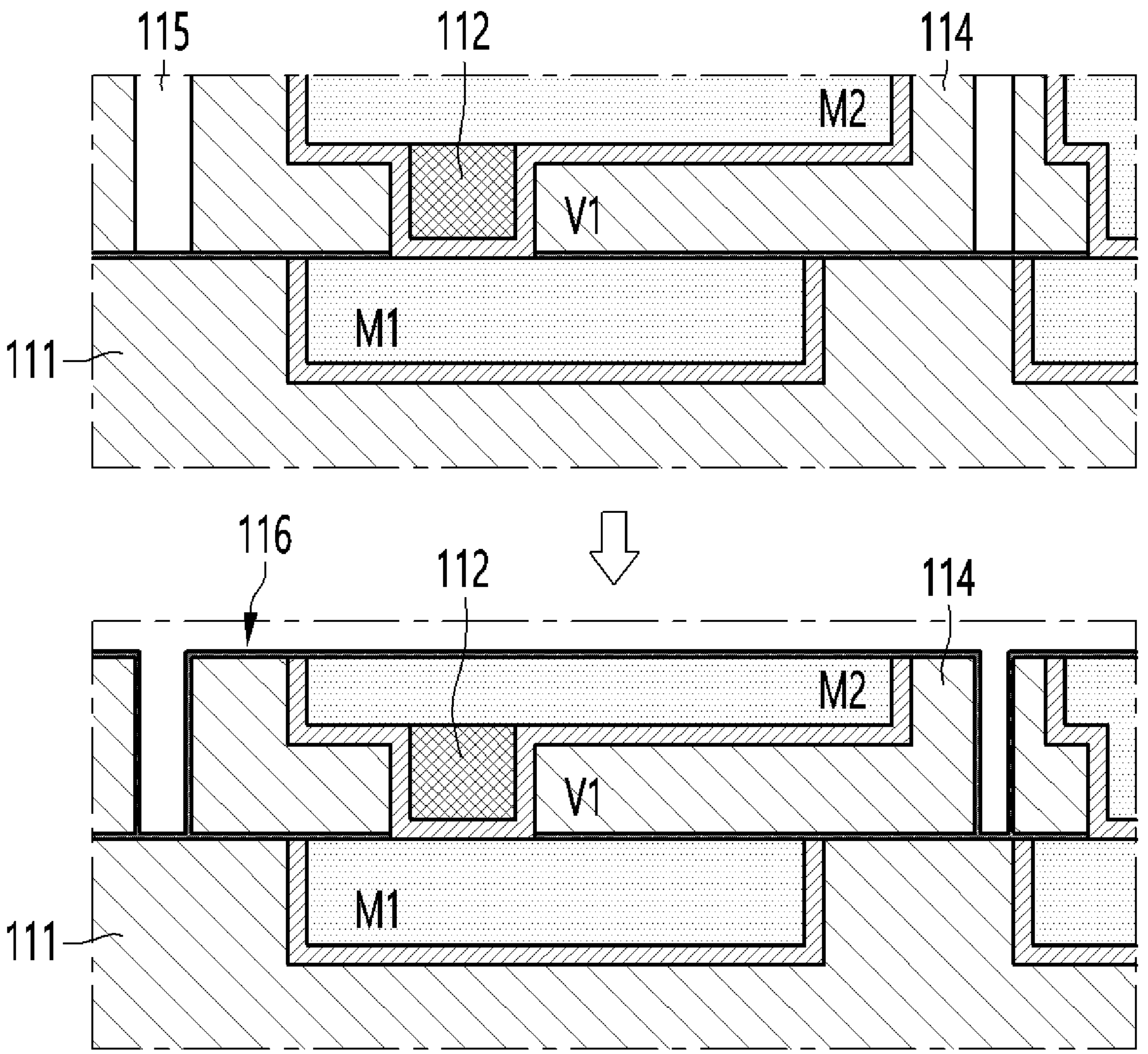
Figure 4B:
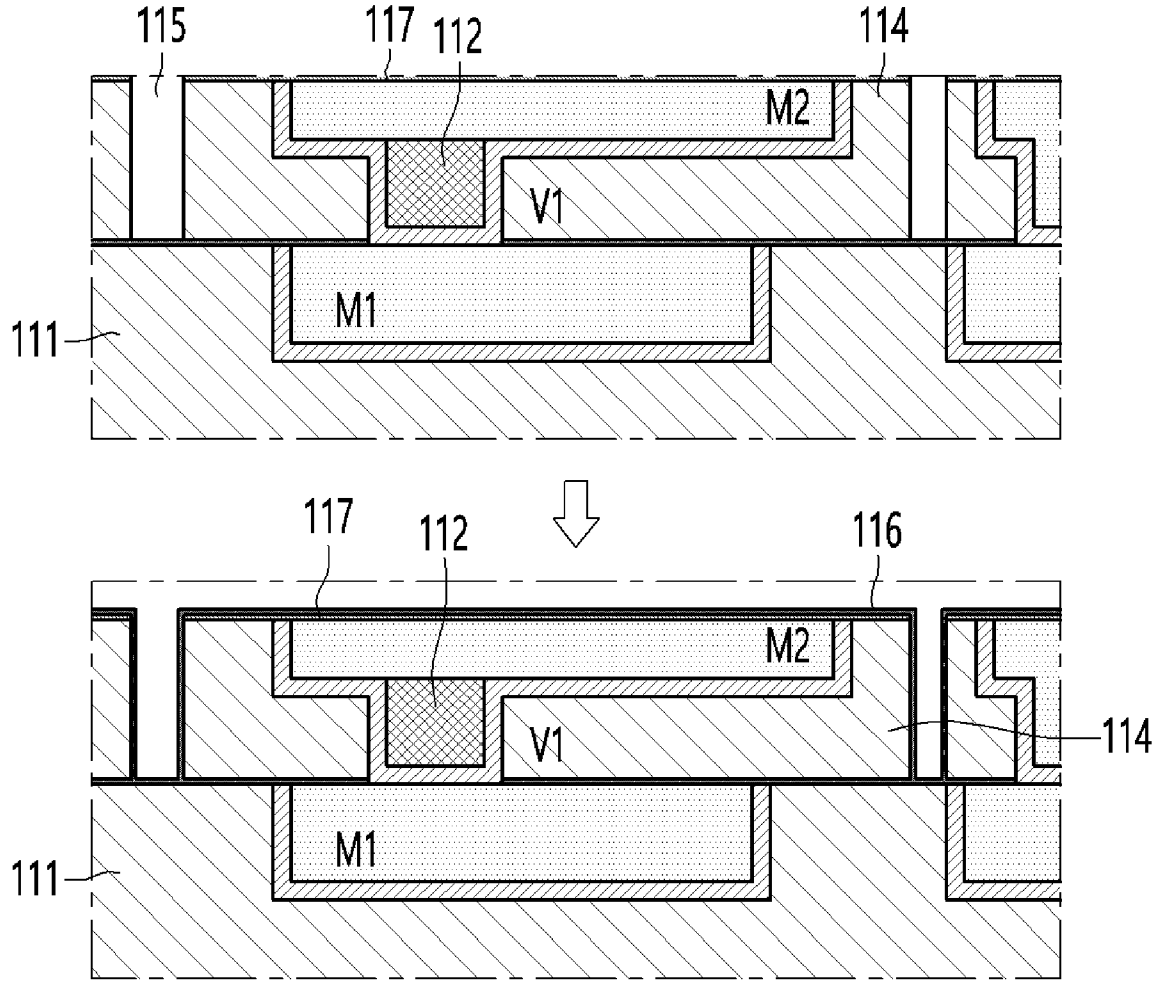

Referring to FIG. 3, a semiconductor device manufactured according to the step of forming the lower layer on the silicon wafer in FIG. 1 may include a first metal layer 111 including a first metal structure M1 and a second metal layer 114 including a via region 112 and a mold 113 for forming a second metal structure M2 (see FIGS. 4A and 4B).

The mold 113 is filled with copper (Cu) and barrier metal, and accordingly, the second metal layer 114 including the second metal structure M2 and the via region 112 may be formed. In this case, the mold 113 may be processed simultaneously on the second metal structure M2 and the via region 112 through a copper dual damascene process. A second metal layer may be planarized through a chemical-mechanical polishing (CMP) process.

Referring to FIG. 4A, the semiconductor device manufactured according to a step of depositing a dielectric layer 116 on a second metal layer 114 includes a plurality of anchor regions 115 on the second metal layer 114. The anchor area 115 may be formed on one side and the other side of the second metal layer 114, respectively. According to the step of depositing the dielectric layer 116 on the second metal layer 114, the semiconductor device may include the semiconductor layer 116 covered on the second metal layer 114 in which a plurality of anchor regions 115 are formed.

However, in a case where the second metal layer 114 and the dielectric layer 116 have to be separated by a certain distance from each other, the semiconductor device may include a sacrificial layer 117 having a preset thickness on the second metal layer 114, as illustrated in FIG. 4B.

According to the step of depositing the dielectric layer 116 on the second metal layer 114, the semiconductor device may include the plurality of anchor regions 115 on the second metal layer 114 including the sacrificial layer 117 having a preset thickness.

According to the step of depositing the dielectric layer 116 on the second metal layer 114, the semiconductor device may include the dielectric layer 116 covered on the second metal layer 114 including the plurality of anchor regions 115 and the sacrificial layer 117.

Figure 5A:
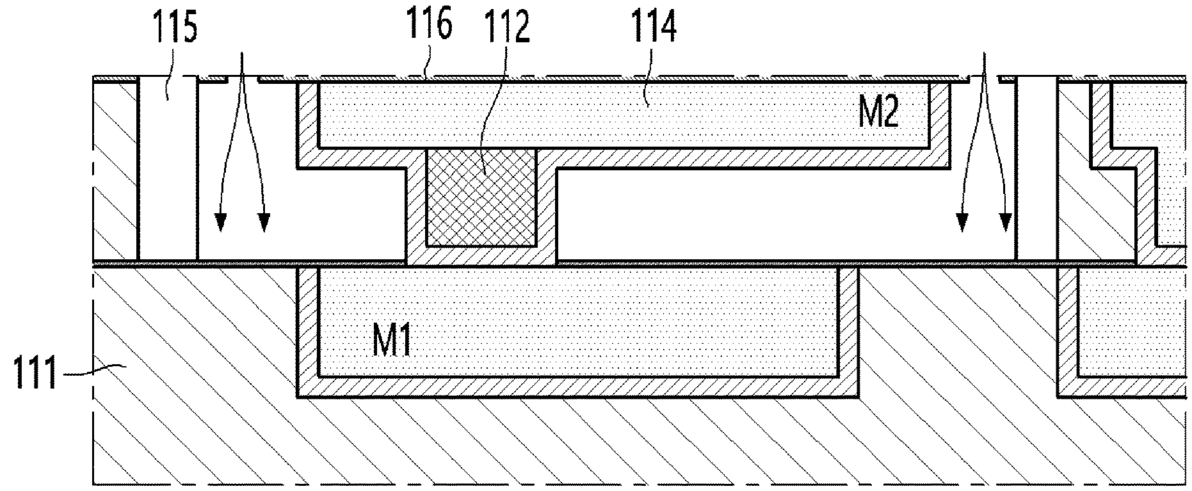

Referring to FIG. 5A, the semiconductor device manufactured according to the step of removing the silicon oxide inside the second metal layer 114 may be in the form from which the silicon oxide inside the second metal layer 114 covered with the dielectric layer 116 is removed. For example, according to the step of removing the silicon oxide inside the second metal layer 114, a partial region of the dielectric layer 116 of the semiconductor device may be removed to expose a silicon oxide film. The silicon oxide inside the second metal layer 114 covered with the dielectric layer 116 may be removed through the removed partial region of the removed dielectric layer 116 through steam etching of a hydrofluoric acid solution.

Figure 5B:
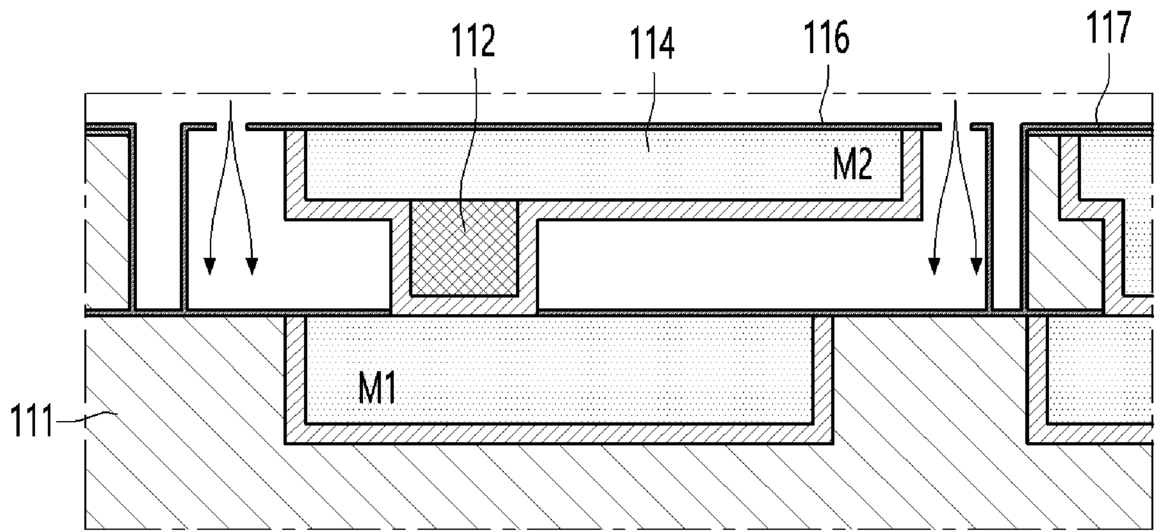

Referring to FIG. 5B, the semiconductor device manufactured according to the step of removing the silicon oxide inside the second metal layer 114 may be in the form from which the sacrificial layer 117 and the silicon oxide inside the second metal layer 114 covered with the dielectric layer 116 may be removed. For example, a silicon oxide film may be exposed by removing a partial region of the dielectric layer 116 of the semiconductor device according to the step of removing the silicon oxide inside the second metal layer 114. The sacrificial layer 117 and the silicon oxide inside the second metal layer 114 covered with the dielectric layer 116 through the removed partial region of the dielectric layer 116 may be removed through steam etching of a hydrofluoric acid solution.

Figure 6A:
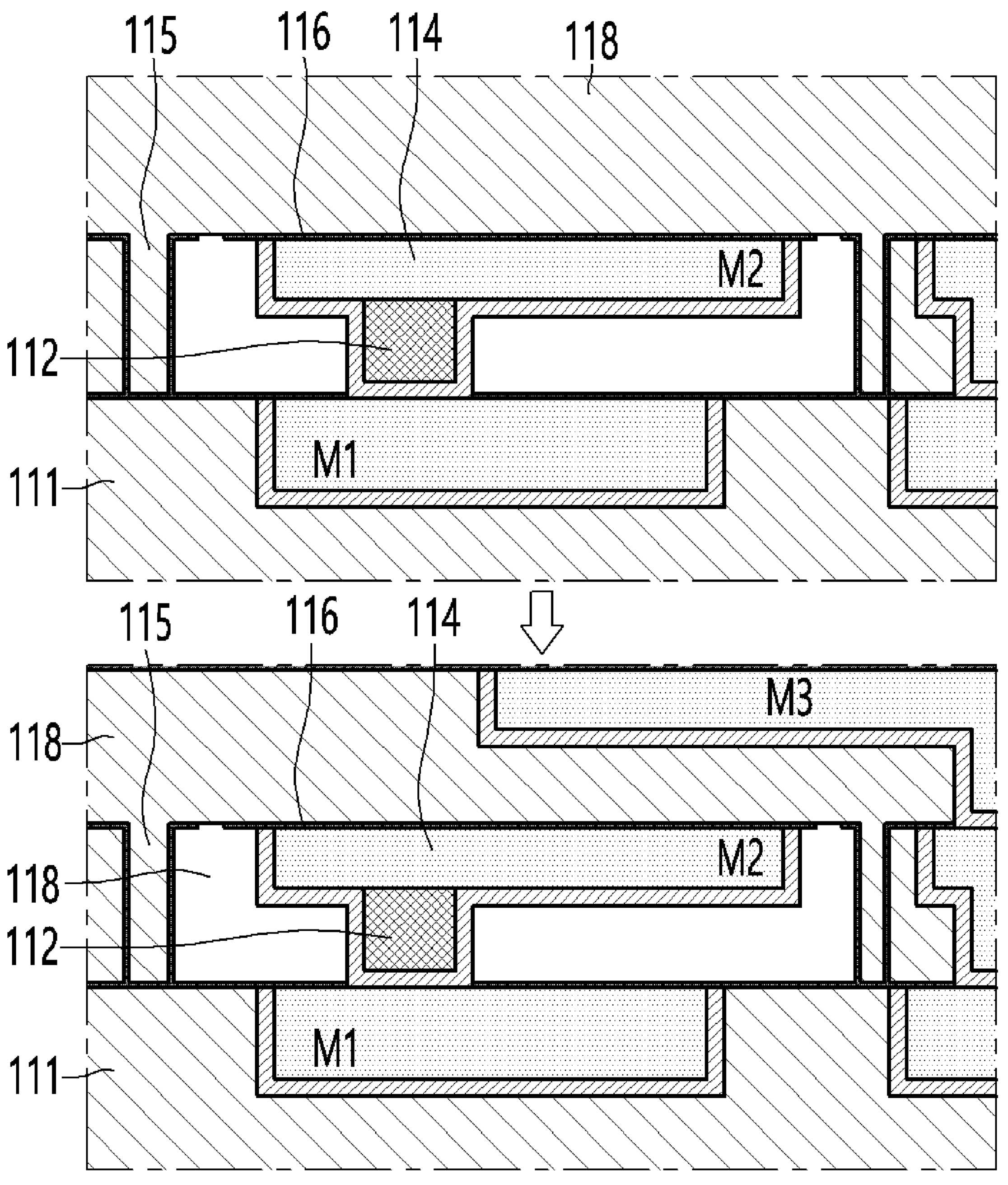

Referring to FIG. 6A, the semiconductor device manufactured according to the step of forming the third metal structure on the upper layer may include an upper layer 118 deposited on the second metal layer 114, and a third metal structure M3 formed on the upper layer.

For example, the semiconductor device may include an IMD material deposited on a second metal layer and a third metal structure formed on an upper layer formed of the IMD material. The third metal structure may be formed in the same process as or a similar process to the process in which the second metal structure is formed, and the IMD material may electrically insulate the second metal structure from the third metal structure.

In the semiconductor device manufactured according to the step of forming the third metal structure on the upper layer, the upper layer 118 is deposited on the dielectric layer 116 of which a part is removed, and accordingly, an inner region of the second metal layer 114 from which the silicon oxide is removed through steam etching of a hydrofluoric acid solution may be in a vacuum or subvacuum state.

Figure 6B:
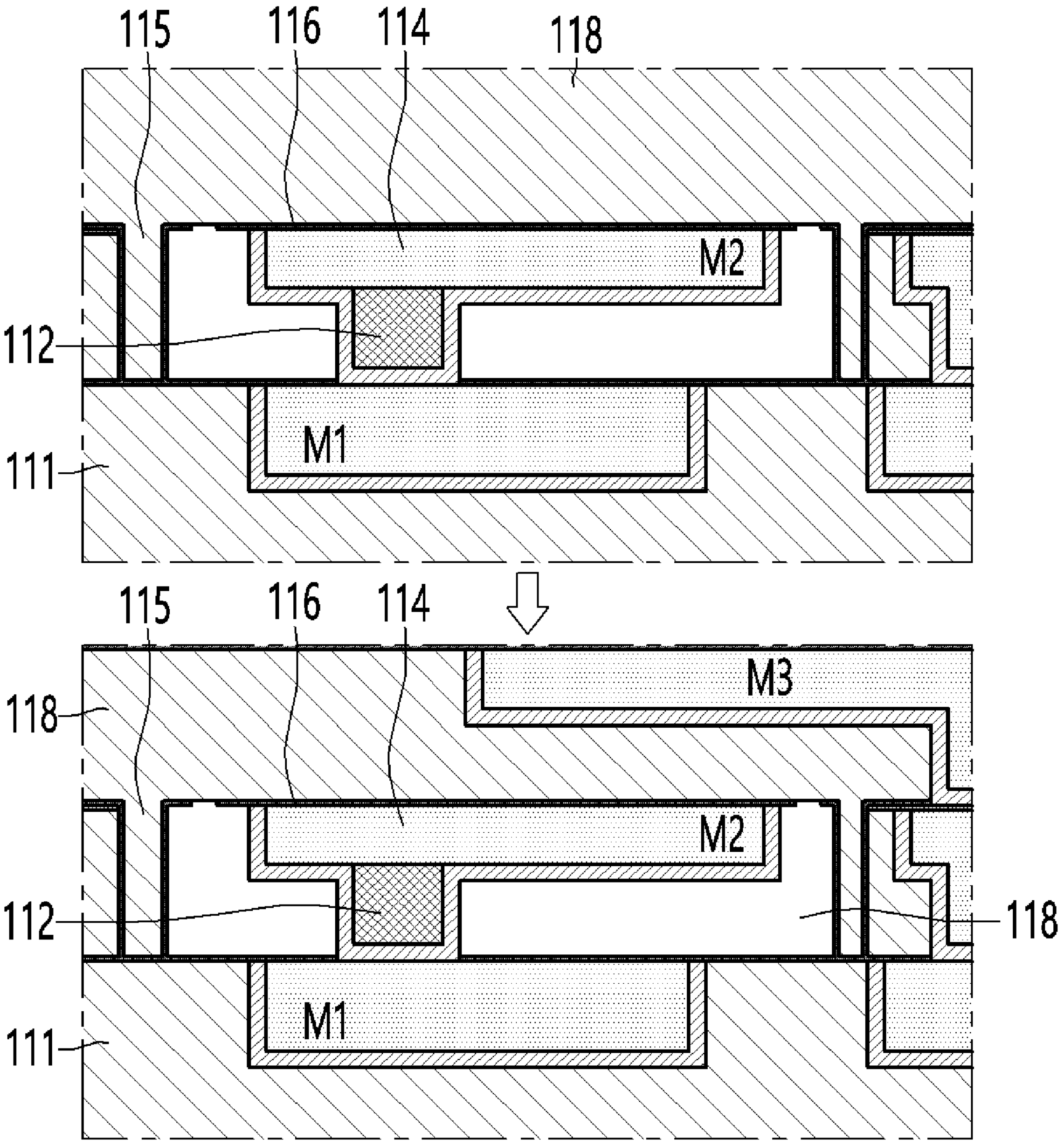

Referring to FIG. 6B, in the semiconductor device manufactured according to the step of forming the third metal structure on the upper layer, the upper layer 118 may be deposited on the second metal layer 114, and the third metal structure M3 may be formed on the upper layer 118.

In the semiconductor device manufactured according to the step of forming the third metal structure on the upper layer, the upper layer 118 is deposited on the dielectric layer 116 of which a part is removed, and accordingly, an inner region of the second metal layer 114 from which the silicon oxide is removed through steam etching of a hydrofluoric acid solution may be in a vacuum or subvacuum state.

Referring to FIGS. 6A and 6B described above, the anchor region 115 may be filled with a material of the upper layer 118 when the upper layer 118 is deposited based on at least one of a width of the anchor region 115 and a deposition rate of the upper layer 118. For example, when the width of the anchor region 115 is increased, the anchor region 115 may be filled with a material of the upper layer 118 even when the deposition rate of the upper layer 118 is fast, and when the width of the anchor region 115 is reduced, the anchor region 115 may not be filled even when the deposition rate of the upper layer 118 is slow. In this case, the material of the upper layer 118 may be an IMD material.

In addition, in order to prevent the IMD material from flowing in through a hole of the dielectric layer 116, a size of the hole of the dielectric layer 116 may be reduced, or a material, which may easily block the hole when depositing the IMD material, may be used.

Figure 7A:
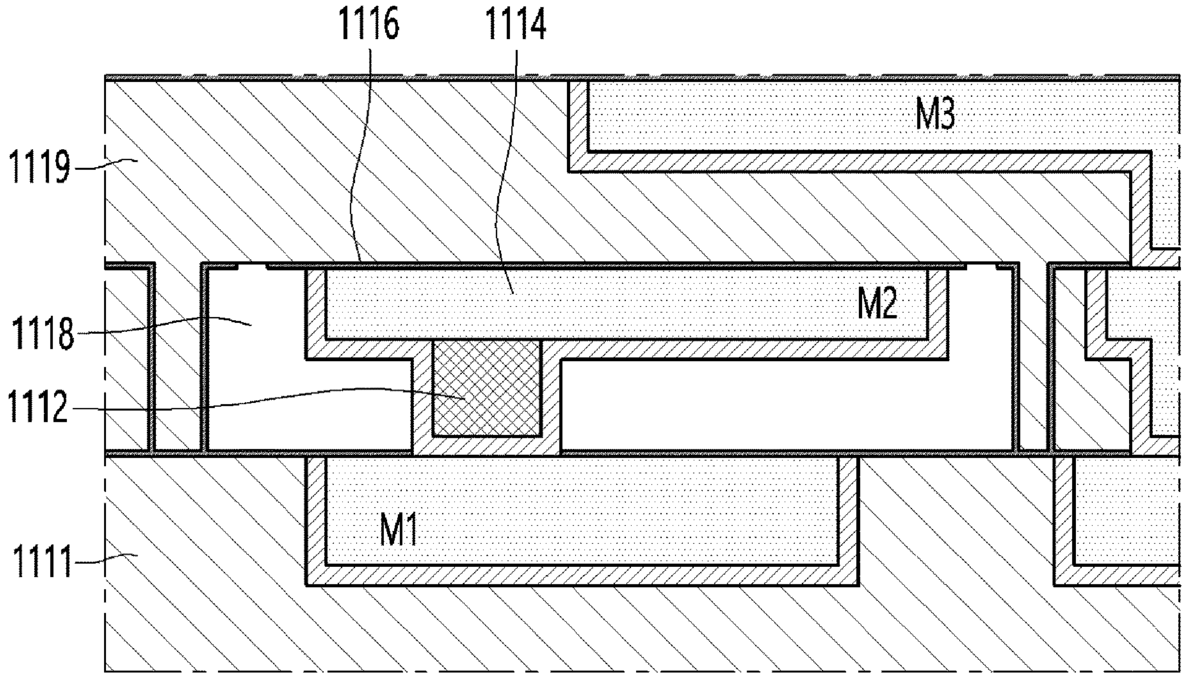
FIGS. 7A and 7B are views illustrating a semiconductor device manufactured based on a vacuum packaging method, according to another embodiment of the present disclosure.
Figure 7B:
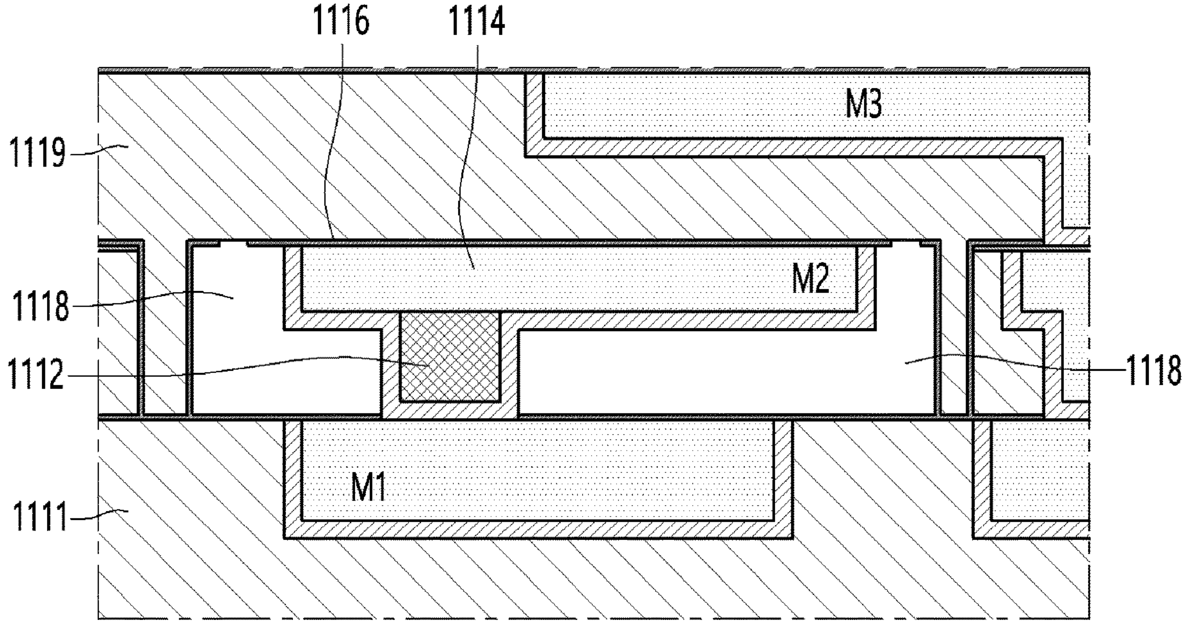

FIGS. 7A and 7B are views illustrating semiconductor devices manufactured based on a vacuum packaging method according to another embodiment of the present disclosure.

Referring to FIG. 7, a packaged semiconductor device includes a lower layer, a dielectric layer 1116, and an upper layer 1119.

The lower layer includes a first metal layer 1111 and a second metal layer 1114. The first metal layer 1111 may include a first metal structure M1. The second metal layer 1114 may include a via region 1112 and a second metal structure M2.

The second metal layer 1114 includes a vacuum or subvacuum region 1118 formed on the first metal layer 1111. For example, the vacuum or subvacuum region 1118 is formed by removing silicon oxide inside the second metal layer 1114 covered by the dielectric layer 1116 through a partial region of the dielectric layer 1116 and depositing an upper layer on the second metal layer 1114.

In the lower layer, a part of the second metal layer 1114 is etched, and thereby, an anchor region is formed.

The dielectric layer 1116 is formed on the second metal layer 1114 from which a partial region is removed and in which the anchor region is formed.

The upper layer includes a third metal structure M3 formed above the second metal layer 1114.

A packaged semiconductor device may implement an energy-saving semiconductor system that requires a low leakage current in implementing a field programmable gate array (FPGA) and artificial intelligence circuit for low power, high integration, and high performance.

Packaged semiconductor devices may be used for system semiconductors used in portable electronic devices that use batteries requiring low standby power.

The packaged semiconductor device may be implemented as a system based on CMOS-NEM including an associative memory.

In the packaged semiconductor device, embedded non-volatile memory may be integrated without affecting a CMOS baseline chip. Accordingly, the packaged semiconductor device may be applied to a high-performance and low-power semiconductor chip that requires a combination of non-memory elements and memory elements.

Because the packaged semiconductor device is a mechanically operated device rather than an electronic device based on semiconductor junction, the packaged semiconductor device may also be used in a military and space memory system that are exposed to high radiation.

Those skilled in the technical field to which the present disclosure belongs will be able to understand that the present disclosure may be easily modified into other specific forms based on the above description without changing the technical idea or essential features of the present disclosure. Therefore, the embodiments described above should be understood in all respects as illustrative and not restrictive. The scope of the present disclosure is indicated by the patent claims to be described below, and all changes or modified forms derived from the meaning and scope of the claims and their equivalent concepts should be construed as being included in the scope of the present disclosure. The scope of the present application is indicated by the claims to be described below rather than the detailed description above, and all changes or modified forms derived from the meaning and scope of the claims and their equivalent concepts should be construed as being included in the scope of the present application.

MODE FOR INVENTION

The form for implementing the disclosure is the same as the best form for implementing the invention described above.

INDUSTRIAL APPLICABILITY

The present disclosure is a vacuum packaging technology for semiconductor devices and may be used in technology for integrating electronic devices into a wiring layer of a CMOS circuit, thereby having industrial applicability.

What is claimed is:

1. A vacuum packaging manufacturing method comprising:

forming, on a silicon wafer, a lower layer including a first metal layer and a second metal layer formed on the first metal layer;

forming anchor regions by etching parts of the second metal layer and depositing a dielectric layer on the second metal layer in which the anchor regions are formed;

exposing a silicon oxide film by removing a partial region of the dielectric layer and removing silicon oxide inside the second metal layer covered by the dielectric layer through the removed partial region of the dielectric layer; and depositing an upper layer on the second metal layer and forming a third metal structure on the upper layer, wherein, as the upper layer is deposited on the second metal layer, a region from which the silicon oxide inside the second metal layer is removed is in a vacuum or subvacuum state.

2. The vacuum packaging manufacturing method of claim 1, wherein the depositing of the dielectric layer includes forming a sacrificial layer having a preset thickness on the second metal layer, and in the removing of the silicon oxide, the sacrificial layer is removed along with the silicon oxide inside the second metal layer, and a gap greater than the preset thickness is formed between the second metal layer and the sacrificial layer.

3. The vacuum packaging manufacturing method of claim 1, further comprising:

planarizing the second metal layer by using a chemical-mechanical polishing (CMP) process after the forming of the lower layer and before forming of the anchor regions.

4. The vacuum packaging manufacturing method of claim 1, wherein the silicon oxide inside the second metal layer is removed based on a steam etching process of a hydrofluoric acid solution.

5. The vacuum packaging manufacturing method of claim 4, wherein the dielectric layer is formed of a material that is not etched by the steam etching process for forming a region from which the silicon oxide inside the second metal layer is removed.

6. The vacuum packaging manufacturing method of claim 1, wherein the anchor regions are respectively formed on one side and another side of the second metal layer.

7. The vacuum packaging manufacturing method of claim 1, wherein the first metal layer is formed of at least one material of inter metal dielectrics (IMD) and inter layer dielectrics (ILD).

8. The vacuum packaging manufacturing method of claim 1, wherein the forming of the lower layer includes:

forming a via region on the first metal layer and a mold region for forming a second metal structure included in the second metal layer; and forming the second metal structure by filling the mold region with copper and barrier metal.

9. A semiconductor device manufactured according to claim 1.

10. A packaged semiconductor device comprising:

a lower layer including a first metal layer, a second metal layer formed on the first metal layer and including a vacuum or a subvacuum region, and anchor regions formed by etching parts of the second metal layer;

a dielectric layer which is formed on the second metal layer in which the anchor regions are formed and from which a part is removed; and an upper layer including a third metal structure formed on top of the second metal layer, wherein the vacuum or subvacuum region is a region from which silicon oxide inside the second metal layer covered by the dielectric layer is removed through a partial region of the dielectric layer and which is formed by depositing the upper layer on the second metal layer.

11. The packaging semiconductor device of claim 10, wherein the silicon oxide inside the second metal layer is removed based on a steam etching process of a hydrofluoric acid solution.

12. The packaging semiconductor device of claim 11, wherein the dielectric layer is formed of a material that is not etched by the steam etching process for forming a region from which the silicon oxide inside the second metal layer is removed.

13. The packaging semiconductor device of claim 10, wherein the anchor regions are respectively formed on one side and another side of the second metal layer.

14. The packaging semiconductor device of claim 10, wherein the first metal layer is formed of at least one material of inter metal dielectrics (IMD) and inter layer dielectrics (ILD).

* * * * *